(12) United States Patent
Moon et al.

(10) Patent No.: US 12,538,761 B2
(45) Date of Patent: Jan. 27, 2026

(54) COMPOSITION FOR SEMICONDUCTOR PHOTORESIST, AND PATTERN FORMATION METHOD USING SAME

(71) Applicant: SAMSUNG SDI CO., LTD., Yongin-si (KR)

(72) Inventors: Kyungsoo Moon, Suwon-si (KR); Eunmi Kang, Suwon-si (KR); Jaehyun Kim, Suwon-si (KR); Jimin Kim, Suwon-si (KR); Taeho Kim, Suwon-si (KR); Changsoo Woo, Suwon-si (KR); Hwansung Cheon, Suwon-si (KR); Seungyong Chae, Suwon-si (KR); Seung Han, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 648 days.

(21) Appl. No.: 18/000,917

(22) PCT Filed: Aug. 20, 2021

(86) PCT No.: PCT/KR2021/011121
§ 371 (c)(1),
(2) Date: Dec. 6, 2022

(87) PCT Pub. No.: WO2022/055149
PCT Pub. Date: Mar. 17, 2022

(65) Prior Publication Data
US 2023/0223262 A1 Jul. 13, 2023

(30) Foreign Application Priority Data
Sep. 14, 2020 (KR) .................. 10-2020-0117881

(51) Int. Cl.
 *H01L 21/027* (2006.01)
 *H01L 21/311* (2006.01)
 *H01L 21/3213* (2006.01)

(52) U.S. Cl.
 CPC .... *H01L 21/0274* (2013.01); *H01L 21/31116* (2013.01); *H01L 21/32135* (2013.01); *H01L 21/32139* (2013.01)

(58) Field of Classification Search
 CPC .......... H01L 21/0274; H01L 21/31116; H01L 21/32135; H01L 21/32139; G03F 7/0042;
 (Continued)

(56) References Cited

U.S. PATENT DOCUMENTS 5,061,599 A 10/1991 Kudo et al.
6,607,867 B1 8/2003 Kim et al.
(Continued)

FOREIGN PATENT DOCUMENTS

CN 110780536 A 2/2020
CN 111032667 A 4/2020
(Continued)

OTHER PUBLICATIONS

Japanese Notice of Allowance dated Aug. 8, 2023, issued in corresponding Japanese Patent Application No. 2022-574370 (3 pages).
(Continued)

*Primary Examiner* — Caleen O Sullivan
(74) *Attorney, Agent, or Firm* — Womble Bond Dickinson (US) LLP

(57) ABSTRACT

Disclosed are a semiconductor photoresist composition and a method of forming patterns using the semiconductor photoresist composition. The semiconductor photoresist composition includes an organometallic compound repre-
(Continued)

sented by Chemical Formula 1 and a solvent and a method of forming patterns using the same.

14 Claims, 3 Drawing Sheets

(58) Field of Classification Search
CPC ........ G03F 7/0041; G03F 7/025; G03F 7/027; G03F 7/20
USPC .................. 430/311, 270.1, 271.1, 272.1
See application file for complete search history.

(56) References Cited

U.S. PATENT DOCUMENTS

| | | |
|---|---|---|
| 2011/0045406 A1 | 2/2011 | Keszler et al. |
| 2013/0224652 A1 | 8/2013 | Bass et al. |
| 2016/0116839 A1 | 4/2016 | Meyers et al. |
| 2017/0102612 A1 | 4/2017 | Meyers et al. |
| 2019/0153001 A1 | 5/2019 | Cardineau et al. |
| 2020/0041897 A1 | 2/2020 | Moon et al. |
| 2020/0117085 A1 | 4/2020 | Moon et al. |
| 2020/0223877 A1 | 7/2020 | Odedra et al. |
| 2021/0325781 A1* | 10/2021 | Moon ................. C07F 7/22 |
| 2021/0333708 A1* | 10/2021 | Moon ................. G03F 7/2004 |
| 2024/0255845 A1* | 8/2024 | Baek ................. G03F 7/0042 |

FOREIGN PATENT DOCUMENTS

| | | |
|---|---|---|
| JP | 2005-023232 A | 1/2005 |
| JP | 3990146 B2 | 10/2007 |
| JP | 5178858 B2 | 4/2013 |
| JP | 5650086 B2 | 1/2015 |
| JP | 5708521 B2 | 4/2015 |
| JP | 2017-207532 A | 11/2017 |
| JP | 2018-502173 A | 1/2018 |
| JP | 2018-017780 A | 2/2018 |
| JP | 2020-021071 A | 2/2020 |
| KR | 10-0269513 B1 | 10/2000 |
| KR | 10-0398312 B1 | 9/2003 |
| KR | 10-2014-0121826 A | 10/2014 |
| KR | 10-2017-0022945 A | 3/2017 |
| KR | 10-2018-0054917 A | 5/2018 |
| KR | 10-2020-0005370 A | 1/2020 |
| KR | 10-2020-0014216 A | 2/2020 |
| KR | 10-2020-0018079 A | 2/2020 |
| KR | 10-2020-0018080 A | 2/2020 |
| KR | 10-2020-0033946 A | 3/2020 |
| KR | 10-2020-0078518 A | 7/2020 |
| TW | 201714897 A | 5/2017 |
| WO | WO 2016-065120 A1 | 4/2016 |
| WO | WO 2016/140057 A1 | 9/2016 |
| WO | WO 2017/066319 A2 | 4/2017 |
| WO | WO 2019/099981 A2 | 5/2019 |
| WO | WO 2019/199467 A1 | 10/2019 |

OTHER PUBLICATIONS

Korean Notice of Allowance dated Sep. 13, 2023, issued in corresponding Korean Patent Application No. 10-2020-0117881 (3 pages).
Del Re, et al., "Low-line edge roughness extreme ultraviolet photoresists of organotin carboxylates", J. Micro/Nanolith. MEMS MOEMS, vol. 14, No. 4, thesis No. 043506, 2015, 8 pages.
Kennedy, et al., "Magnetic Double Resonance Studies of Tin-119 Chemical Shifts in Compounds with Tin-Sulphur Bonds and Related Species", Perkin Transactions 2, vol. 1 No. 1, 1975, pp. 1234-1239.
Anderson, et al., "The SEMATECH Berkeley MET: extending EUV learning to 16-nm half pitch", Proc. SPIE vol. 7969, 79690R-6, 2011, 7 pages.
Okamoto, et al., "Peroxypolytungstic acids: A new inorganic resist material", Applied Physics Letters, vol. 49, No. 5, 1986, pp. 298-300.
Stowers, et al., "Directly patterned inorganic hardmask for EUV lithography", Proc. of SPIE, vol. 7969, 796915-2, 2011, 11 pages.
International Search Report of PCT/KR2021/011121, 11-2424-2021, 6 pp.
Chinese Office Action for CN Patent Application No. 202180036970. 5. dated Dec. 23, 2024, 5 pages.

* cited by examiner

【Figure 1】
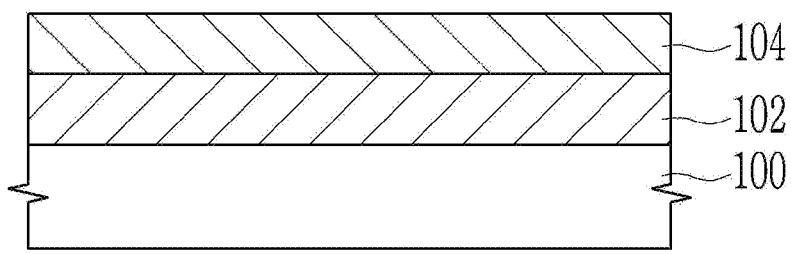
【Figure 2】
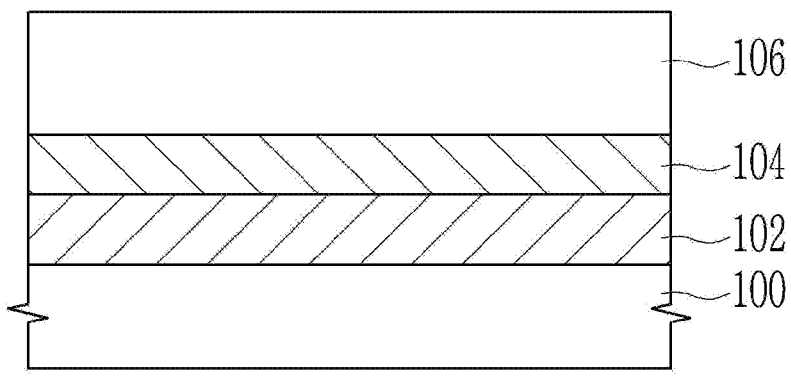

【Figure 3】
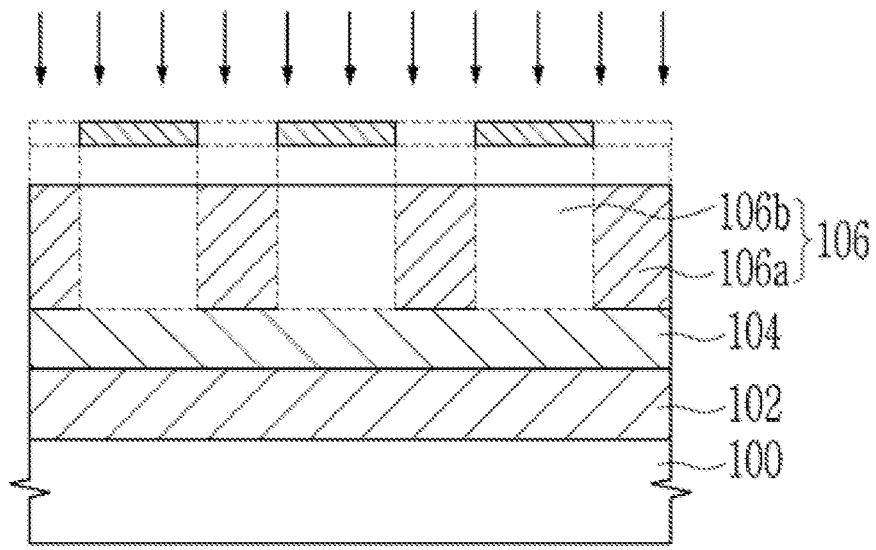
【Figure 4】
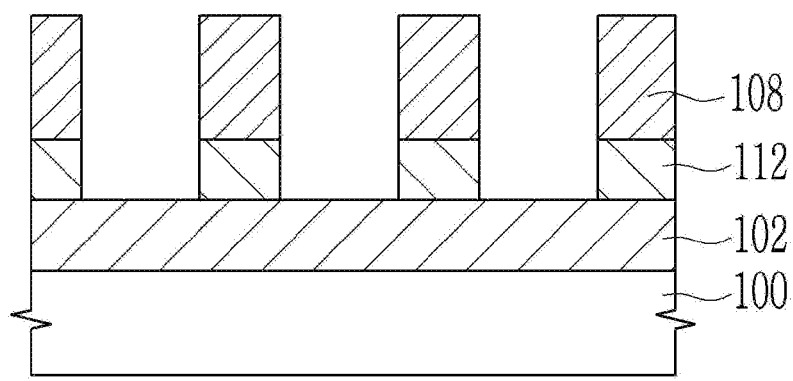

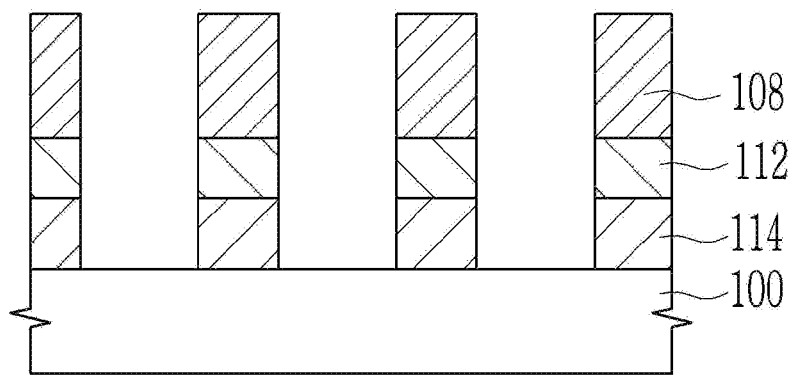
【Figure 5】

COMPOSITION FOR SEMICONDUCTOR PHOTORESIST, AND PATTERN FORMATION METHOD USING SAME

CROSS-REFERENCE TO RELATED APPLICATIONS

This application is a U.S. National Phase Patent Application of International Application Number PCT/KR2021/011121, filed on Aug. 20, 2021, which claims priority of Korean Patent Application Number 10-2020-0117881, filed on Sep. 14, 2020, the entire content of each of which is incorporated herein by reference.

TECHNICAL FIELD

This disclosure relates to a semiconductor photoresist composition and a method of forming patterns using the same.

BACKGROUND ART

EUV (extreme ultraviolet) lithography is paid attention to as one essential technology for manufacturing a next generation semiconductor device.

The EUV lithography is a pattern-forming technology using an EUV ray having a wavelength of 13.5 nm as an exposure light source. According to the EUV lithography, it is known that an extremely fine pattern (e.g., less than or equal to 20 nm) may be formed in an exposure process during a manufacture of a semiconductor device.

The extreme ultraviolet (EUV) lithography is realized through development of compatible photoresists which can be performed at a spatial resolution of less than or equal to 16 nm. Currently, efforts to satisfy insufficient specifications of traditional chemically amplified (CA) photoresists such as a resolution, a photospeed, and feature roughness (or also referred to as a line edge roughness or LER) for the next generation device are being made.

An intrinsic image blurring due to an acid catalyzed reaction in these polymer-type photoresists limits a resolution in small feature sizes, which has been well known in electron beam (e-beam) lithography for a long time. The chemically amplified (CA) photoresists are designed for high sensitivity, but since their typical elemental makeups reduce light absorbance of the photoresists at a wavelength of 13.5 nm and thus decrease their sensitivity, the chemically amplified (CA) photoresists may partially have more difficulties under an EUV exposure.

In addition, the CA photoresists may have difficulties in the small feature sizes due to roughness issues, and line edge roughness (LER) of the CA photoresists experimentally turns out to be increased, as a photospeed is decreased partially due to an essence of acid catalyst processes. Accordingly, a novel high performance photoresist is required in a semiconductor industry because of these defects and problems of the CA photoresists.

In order to overcome the aforementioned drawbacks of the chemically amplified (CA) organic photosensitive composition, an inorganic photosensitive composition has been researched. The inorganic photosensitive composition is mainly used for negative tone patterning having resistance against removal by a developer composition due to chemical modification through nonchemical amplification mechanism. The inorganic composition contains an inorganic element having a higher EUV absorption rate than hydrocarbon and thus may secure sensitivity through the non-chemical amplification mechanism and in addition, is less sensitive about a stochastic effect and thus known to have low line edge roughness and the small number of defects.

Inorganic photoresists based on peroxopolyacids of tungsten mixed with tungsten, niobium, titanium, and/or tantalum have been reported as radiation sensitive materials for patterning (U.S. Pat. No. 5,061,599; H. Okamoto, T. Iwayanagi, K. Mochiji, H. Umezaki, T. Kudo, Applied Physics Letters, 49 5, 298-300, 1986).

These materials are effective for patterning large pitches for s bilayer configuration as far ultraviolet (deep UV), X-ray, and electron beam sources.

More recently, when cationic hafnium metal oxide sulfate (HfSOx) materials along with a peroxo complexing agent has been used to image a 15 nm half-pitch (HP) through projection EUV exposure, impressive performance has been obtained (US 2011-0045406; J. K. Stowers, A. Telecky, M. Kocsis, B. L. Clark, D. A. Keszler, A. Grenville, C. N. Anderson, P. P. Naulleau, Proc. SPIE, 7969, 796915, 2011). This system exhibits the highest performance of a non-CA photoresist and has a practicable photospeed near to a requirement for an EUV photoresist. However, the hafnium metal oxide sulfate material having the peroxo complexing agent has a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development should be performed in a TMAH (tetramethylammonium hydroxide) solution at an extremely high concentration of 25 wt % and the like.

Recently, active research has been conducted as it is known that molecules containing tin have excellent absorption of extreme ultraviolet rays. As for an organic tin polymer among them, alkyl ligands are dissociated by light absorption or secondary electrons produced thereby, and are cross-linked with adjacent chains through oxo bonds and thus enable the negative tone patterning which may not be removed by an organic developing solution. This organic tin polymer exhibits greatly improved sensitivity as well as maintains a resolution and line edge roughness, but the patterning characteristics need to be additionally improved for commercial availability.

DISCLOSURE

Technical Problem

An embodiment provides a semiconductor photoresist composition having excellent resolution, solubility, and storage stability characteristics.

Another embodiment provides a method of forming a pattern using the semiconductor photoresist composition.

Technical Solution

The semiconductor photoresist composition according to an embodiment includes an organometallic compound represented by Chemical Formula 1 and a solvent.

[Chemical Formula 1]

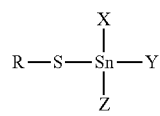

In Chemical Formula 1,

R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, —C(=O)R$^1$ (wherein, R$^1$ is hydrogen or a substituted or unsubstituted C1 to C20 alkyl group), or a combination thereof, X, Y, and Z are each independently —OR$^a$, —SR$^b$, —OC(=O)R$^c$, or —SC(=O)R$^d$, R$^a$ and R$^b$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and R$^c$ and R$^d$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

R may be a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, —C(=O)R$^1$ (wherein, R$^1$ is hydrogen or a substituted or unsubstituted C1 to C8 alkyl group), or a combination thereof.

R may be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, a formyl group, an acetyl group, a propanoyl group, a butanoyl group, or a combination thereof.

R$^a$ and the R$^b$ may each independently be a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, and R$^c$ and R$^d$ may each independently be hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof. R$^a$ and R$^b$ may each independently be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and R$^c$ and R$^d$ may each independently be hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

The organometallic compound may include one of compounds represented by Chemical Formula a to Chemical Formula t or a combination thereof

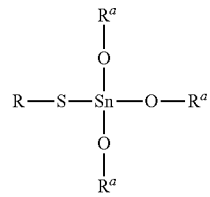

[Chemical Formula a]

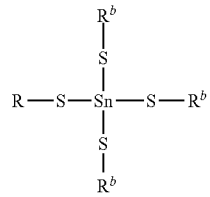

[Chemical Formula b]

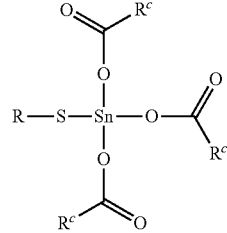

[Chemical Formula c]

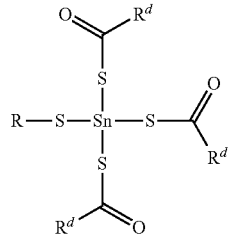

[Chemical Formula d]

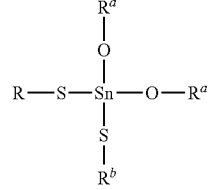

[Chemical Formula e]

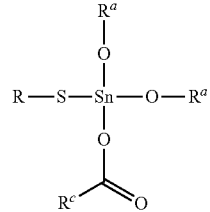

[Chemical Formula f]

[Chemical Formula g]
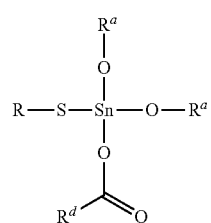
[Chemical Formula h]
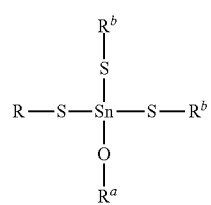
[Chemical Formula i]
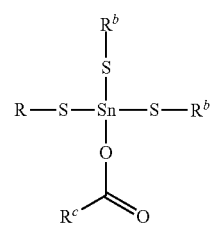
[Chemical Formula j]
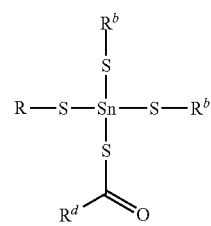
[Chemical Formula k]
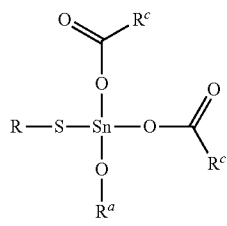
[Chemical Formula l]
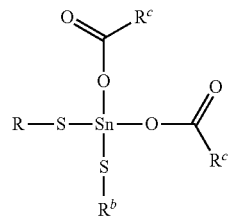
[Chemical Formula m]
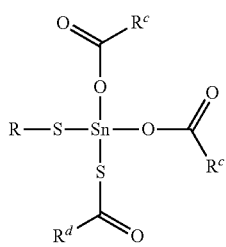
[Chemical Formula n]
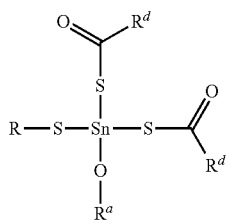
[Chemical Formula o]
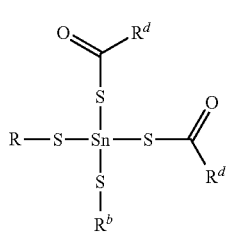
[Chemical Formula p]
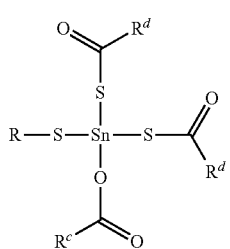
[Chemical Formula q]
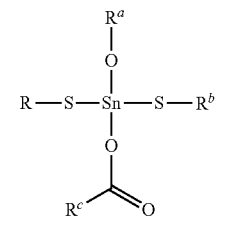
[Chemical Formula r]
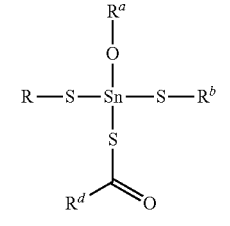
[Chemical Formula s]
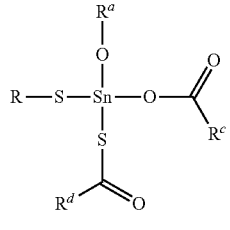
[Chemical Formula t]
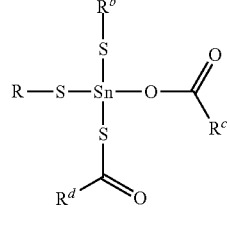

In Chemical Formula a to Chemical Formula t, definitions for $R^a$ to $R^d$ are the same as described above.

The semiconductor photoresist composition may include 1 wt % to 30 wt % of the organometallic compound represented by Chemical Formula 1, based on 100 wt % of the semiconductor photoresist composition.

The semiconductor photoresist composition may further include an additive of a surfactant, a cross-linking agent, a leveling agent, or a combination thereof.

The method of forming patterns according to an embodiment includes forming an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

The photoresist pattern may be formed using light in a wavelength of 5 nm to 150 nm.

The method of forming patterns may further include providing a resist underlayer formed between the substrate and the photoresist layer.

The photoresist pattern may have a width of 5 nm to 100 nm.

Advantageous Effects

Since the semiconductor photoresist composition according to an embodiment has relatively excellent resolution and is easy to handle, it can provide a photoresist pattern that has excellent limit resolution and does not collapse even if it has a high aspect ratio.

DESCRIPTION OF THE DRAWINGS

FIGS. 1 to 5 are cross-sectional views for explaining a method of forming patterns using a semiconductor photoresist composition according to an embodiment.

DESCRIPTION OF SYMBOLS

100: substrate
102: thin film
104: resist underlayer
106: photoresist layer
106a: exposed region
106b: non-exposed region
108: photoresist pattern
112: organic layer pattern
114: thin film pattern

BEST MODE

Hereinafter, referring to the drawings, embodiments of the present invention are described in detail. In the following description of the present invention, the well-known functions or constructions will not be described in order to clarify the present invention.

In order to clearly illustrate the present disclosure, the description and relationships are omitted, and throughout the disclosure, the same or similar configuration elements are designated by the same reference numerals.

Also, since the size and thickness of each configuration shown in the drawing are arbitrarily shown for better understanding and ease of description, the present invention is not necessarily limited thereto.

In the drawings, the thickness of layers, films, panels, regions, etc., are exaggerated for clarity. In the drawings, the thickness of a part of layers or regions, etc., is exaggerated for clarity. It will be understood that when an element such as a layer, film, region, or substrate is referred to as being "on" another element, it can be directly on the other element or intervening elements may also be present.

As used herein, "substituted" refers to replacement of a hydrogen atom by deuterium, a halogen, a hydroxy group, a cyano group, a nitro group, —NRR' (wherein, R and R' are independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof. "Unsubstituted" refers to non-replacement of a hydrogen atom by another substituent and remaining of the hydrogen atom.

As used herein, when a definition is not otherwise provided, "an alkyl group" refers to a linear or branched aliphatic hydrocarbon group. The alkyl group may be "a saturated alkyl group" without any double bond or triple bond.

The alkyl group may be a C1 to C8 alkyl group. For example, the alkyl group may be a C1 to C7 alkyl group, a C1 to C6 alkyl group, a C1 to C5 alkyl group, or a C1 to C4 alkyl group. For example, the C1 to C4 alkyl group may be a methyl group, an ethyl group, a propyl group, an isopropyl group, an n-butyl group, an isobutyl group, a sec-butyl group, a tert-butyl group, or a 2,2-dimethylpropyl group.

As used herein, when a definition is not otherwise provided, "cycloalkyl group" refers to a monovalent cyclic aliphatic hydrocarbon group.

The cycloalkyl group may be a C3 to C8 cycloalkyl group, for example, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but is not limited thereto.

As used herein, "an aliphatic unsaturated organic group" refers to a hydrocarbon group including a bond in which the bond between the carbon and carbon atom in the molecule is a double bond, a triple bond, or a combination thereof.

The aliphatic unsaturated organic group may be a C2 to C8 aliphatic unsaturated organic group. For example, the aliphatic unsaturated organic group may be a C2 to C7 aliphatic unsaturated organic group, a C2 to C6 aliphatic unsaturated organic group, a C2 to C5 aliphatic unsaturated organic group, or a C2 to C4 aliphatic unsaturated organic group. For example, the C2 to C4 aliphatic unsaturated organic group may be a vinyl group, an ethynyl group, an allyl group, a 1-propenyl group, a 1-methyl-1-propenyl group, a 2-propenyl group, a 2-methyl-2-propenyl group, a 1-propynyl group, a 1-methyl-1 propynyl group, a 2-propynyl group, a 2-methyl-2-propynyl group, a 1-butenyl group, a 2-butenyl group, a 3-butenyl group, a 1-butynyl group, a 2-butynyl group, or a 3-butynyl group.

As used herein, "aryl group" refers to a substituent in which all atoms in the cyclic substituent have a p-orbital and these p-orbitals are conjugated and may include a monocyclic or fused ring polycyclic functional group (i.e., rings sharing adjacent pairs of carbon atoms) functional group.

As used herein, unless otherwise defined, "alkenyl group" refers to an aliphatic unsaturated alkenyl group including at least one double bond as a linear or branched aliphatic hydrocarbon group.

As used herein, unless otherwise defined, "alkynyl group" refers to an aliphatic unsaturated alkynyl group including at least one triple bond as a linear or branched aliphatic hydrocarbon group.

In the formulas described herein, S means sulfur (S) element.

Hereinafter, a semiconductor photoresist composition according to an embodiment is described.

The semiconductor photoresist composition according to an embodiment of the present invention includes organometallic compound and a solvent, wherein the organometallic compound is represented by Chemical Formula 1.

[Chemical Formula 1]

In Chemical Formula 1,

R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, —C(=O)R$^1$(wherein, R$^1$ is hydrogen or a substituted or unsubstituted C1 to C20 alkyl group), or a combination thereof, X, Y, and Z are each independently —OR$^a$, —SR$^b$, —OC(=O)R$^c$, or —SC(=O)R$^d$, R$^a$ and R$^b$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and R$^c$ and R$^d$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The compound represented by Chemical Formula 1 is an organotin compound, wherein tin may intensively absorb extreme ultraviolet (EUV) light at 13.5 nm and thus have excellent sensitivity regarding light having high energy. Accordingly, the organotin compound according to the embodiment may exhibit superior stability and sensitivity compared with conventional organic and/or inorganic resists.

Since the organometallic compound represented by Chemical Formula 1 essentially includes a -SR group, the organometallic compound forms a Sn—SR bond, and the Sn—SR bond is stronger than the Sn—OR bond. Therefore, the organometallic compound may have high stability in water. In addition, since the Sn—SR bond has a lower bond dissociation energy for extreme ultraviolet exposure than Sn—OR, the sensitivity characteristics of the organometallic compound may be improved. Therefore, the semiconductor photoresist composition including the organometallic compound having the Sn—SR bond may be easily handled, storage stability and solubility characteristics and sensitivity may be improved.

On the other hand, the compound represented by Chemical Formula 1 includes X, Y, and Z as a ligand connected to a tin element, wherein X, Y, and Z are each independently —OR$^a$, —SR$^b$, —OC(=O)R$^c$, or —SC(=O)R$^d$. These organic ligands are hydrolyzed and dehydrated by heat treatment under an acidic, basic, or neutral catalyst or without heat treatment to form a Sn—O—Sn bond between the organotin compounds, thereby forming an organotin oxide polymer derived from the organometallic compound represented by Chemical Formula 1.

When the ligands of X, Y, and Z are —SR$^b$ or —SC(=O)R$^d$, the organometallic compound includes a Sn—S bond, and the bond between Sn—S has a relatively low bond strength. Since the organometallic compound of the present invention including the Sn—S bond may have improved water stability, and the storage stability and solubility of the semiconductor photoresist composition including the same may be improved. In addition, the Sn—S bond may exhibit excellent sensitivity as the bond dissociation energy to extreme ultraviolet exposure is relatively low. The ligands of X, Y, and Z are —OR$^a$ or —OC(=O)R$^c$, and when the organometallic compound includes —OR$^a$ or —OC(=O)R$^c$ as a ligand, a pattern formed using a semiconductor photoresist composition including the same may exhibit excellent limit resolution.

Therefore, when —OR$^a$, —SR$^b$, —OC(=O)R$^c$, or —SC(=O)R$^d$ is mixed and used as a ligand of an organometallic compound, a semiconductor photoresist composition may have excellent storage stability and solubility while also excellent sensitivity and resolution.

In addition, X, Y, and Z of Chemical Formula 1 that is —OR$^a$, —SR$^b$, —OC(=O)R$^c$, or —SC(=O)R$^d$ may determine the solubility of the compound in a solvent.

R may be, for example, a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, —C(=O)R$^1$ (wherein, R$^1$ is hydrogen or a substituted or unsubstituted C1 to C8 alkyl group), or a combination thereof, for example, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, a formyl group, an acetyl group, a propanoyl group, a butanoyl group, or a combination thereof.

R$^a$ and R$^b$ may be for example independently a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, for example, methyl group, ethyl group, propyl group, butyl group, isopropyl group, tert-butyl group, 2,2-dimethylpropyl group, cyclopropyl group, cyclobutyl group, cyclopentyl group, cyclohexyl group, ethenyl group, a propenyl group, a butenyl group, an ethynyl group, a propynyl group, a butynyl group, a phenyl group, a tolyl group, a xylene group, a benzyl group, or a combination thereof.

$R^c$ and $R^d$ may be, for example, each independently hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, for example, hydrogen, methyl group, ethyl group, propyl group, butyl group, isopropyl group, tert-butyl group, 2,2-dimethylpropyl group, cyclopropyl group, cyclobutyl group, cyclopentyl group, cyclohexyl group, ethenyl group, a propenyl group, a butenyl group, an ethynyl group, a propynyl group, a butynyl group, a phenyl group, a tolyl group, a xylene group, a benzyl group, or a combination thereof.

The organometallic compound may include one of compounds represented by Chemical Formula a to Chemical Formula t or a combination thereof.

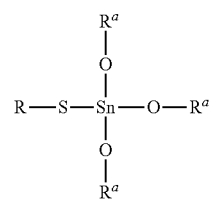

[Chemical Formula a]

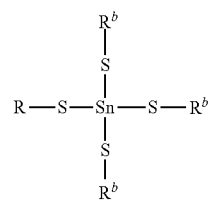

[Chemical Formula b]

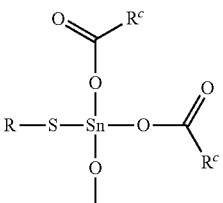

[Chemical Formula c]

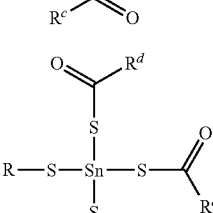

[Chemical Formula d]

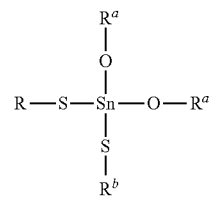

[Chemical Formula e]

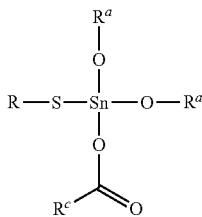

[Chemical Formula f]

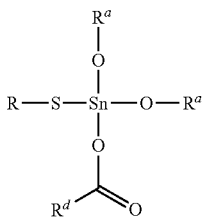

[Chemical Formula g]

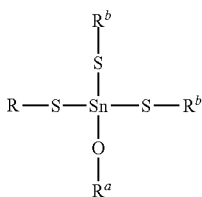

[Chemical Formula h]

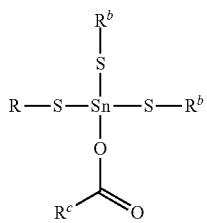

[Chemical Formula i]

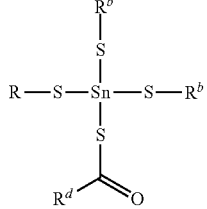

[Chemical Formula j]

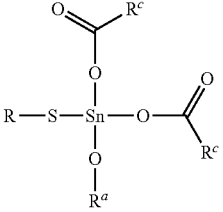

[Chemical Formula k]

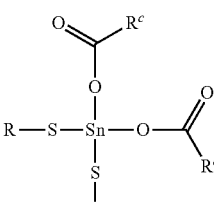

[Chemical Formula l]

[Chemical Formula m]

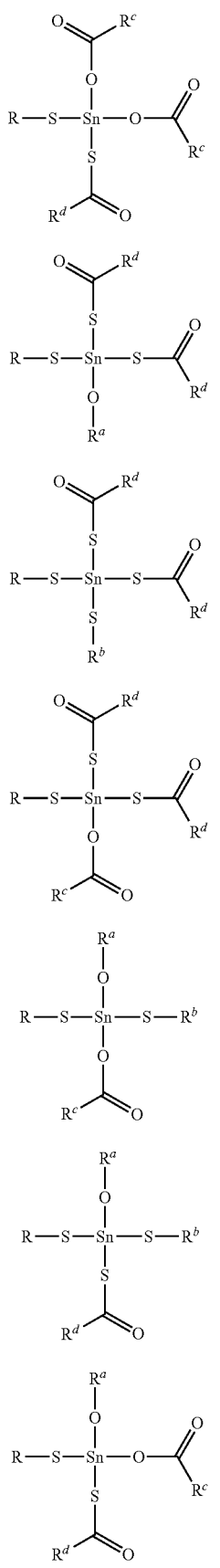

[Chemical Formula n]

[Chemical Formula o]

[Chemical Formula p]

[Chemical Formula q]

[Chemical Formula r]

[Chemical Formula s]

[Chemical Formula t]

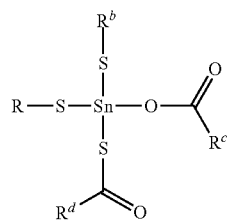

In Chemical Formula a to Chemical Formula t, definitions for $R^a$ to $R^d$ are the same as described above.

Referring to the compounds represented by Chemical Formula a to Chemical Formula t, the organometallic compound according to an embodiment may include —$OR^a$, —$SR^b$, —OC(=O)$R^c$, or —SC(=O)$R^d$ in various combinations as X, Y, and Z ligands.

A generally-used organic resist has insufficient etch resistance and thus a pattern having a high aspect ratio may collapse.

On the other hand, a conventional inorganic resist (e.g., a metal oxide compound) uses a mixture of sulfuric acid having high corrosiveness and hydrogen peroxide and thus is difficult to handle and has insufficient storage-stability, is a little relatively difficult to structurally change for performance improvement as a composite mixture, and should use a developing solution having a high concentration.

On the contrary, the semiconductor resist composition according to an embodiment may have relatively improved etch resistance, sensitivity, and resolution, and may be handled more easily compared with a conventional organic and/or inorganic resists as the organometallic compound includes a structural unit where various organic groups are bonded with the central metal atom as described above.

In the semiconductor photoresist composition according to an embodiment, the organometallic compound represented by Chemical Formula 1 may be included in an amount of 1 wt % to 30 wt %, for example, 1 wt % to 25 wt %, for example, 1 wt % to 20 wt %, for example, 1 wt % to 15 wt %, for example, 1 wt % to 10 wt %, for example, 1 wt % to 5 wt % based on the total weight of the composition, but is not limited thereto. When the organometallic compound represented by Chemical Formula 1 is included in an amount within the above range, storage stability and solubility characteristics of the composition for semiconductor photoresists are improved, thin film formation is facilitated, and resolution characteristics are improved.

The solvent of the semiconductor resist composition according to the embodiment may be an organic solvent, and may be for example aromatic compounds (e.g., xylene, toluene, etc.), alcohols (e.g., 4-methyl-2-pentenol, 4-methyl-2-propanol, 1-butanol, methanol, isopropyl alcohol, 1-propanol), ethers (e.g., anisole, tetrahydrofuran), esters (n-butyl acetate, propylene glycol monomethyl ether acetate, ethyl acetate, ethyl lactate), ketones (e.g., methyl ethyl ketone, 2-heptanone), or a mixture thereof, but is not limited thereto.

In an embodiment, the semiconductor resist composition may further include a resin in addition to the organometallic compound and the solvent.

The resin may be a phenolic resin including at least one aromatic moiety of Group 1.

[Group 1]

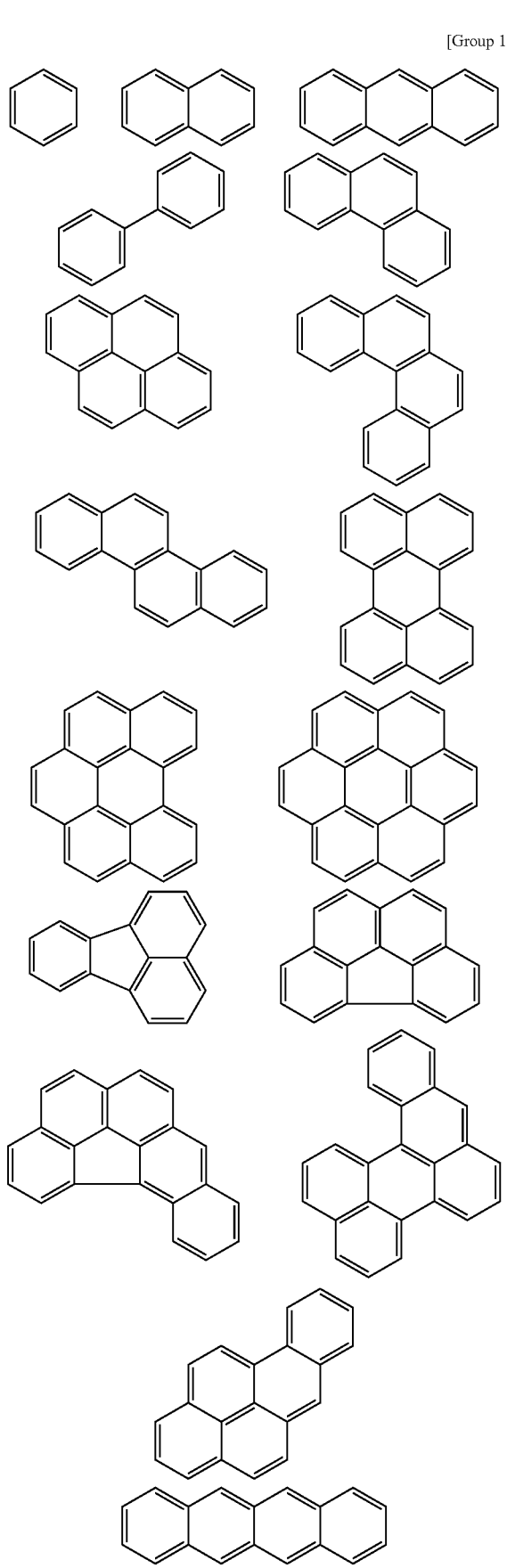
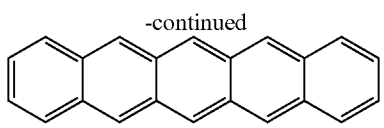

The resin may have a weight average molecular weight of 500 to 20,000.

The resin may be included in an amount of 0.1 wt % to 50 wt % based on the total amount of the semiconductor resist composition.

When the resin is included in the above content range, it may have excellent etch resistance and heat resistance.

On the other hand, the semiconductor resist composition according to an embodiment may consist of the organometallic compound, the solvent, and the resin. However, the semiconductor resist composition according to the embodiment may further include additives as needed. Examples of the additives may be a surfactant, a cross-linking agent, a leveling agent, an organic acid, a quencher, or a combination thereof.

The surfactant may include for example an alkyl benzene sulfonate salt, an alkyl pyridinium salt, polyethylene glycol, a quaternary ammonium salt, or a combination thereof, but is not limited thereto.

The cross-linking agent may be for example a melamine-based cross-linking agent, a substituted urea-based cross-linking agent, an acryl-based cross-linking agent, an epoxy-based cross-linking agent, or a polymer-based cross-linking agent, but is not limited thereto. It may be a cross-linking agent having at least two cross-linking forming substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylpropane triglycidyl ether, 1,3-bis(glycidoxypropyl)tetramethyldisiloxane, methoxymethylated urea, butoxymethylated urea, or methoxymethylated thiourea, and the like.

The leveling agent may be used for improving coating flatness during printing and may be a commercially available known leveling agent.

The organic acid may be p-toluenesulfonic acid, benzenesulfonic acid, p-dodecylbenzene sulfonic acid, 1,4-naphthalene disulfonic acid, methane sulfonic acid, a luorinated sulfonium salt, malonic acid, citric acid, propionic acid, methacrylic acid, oxalic acid, lactic acid, glycolic acid, succinic acid, or a combination thereof, but is not limited thereto.

The quencher may be diphenyl(p-tryl) amine, methyl diphenyl amine, triphenyl amine, phenylenediamine, naphthylamine, diaminonaphthalene, or a combination thereof.

A use amount of the additives may be controlled depending on desired properties.

In addition, the semiconductor photoresist composition may further include a silane coupling agent as an adherence enhancer in order to improve a close-contacting force with the substrate (e.g., in order to improve adherence of the semiconductor photoresist composition to the substrate). The silane coupling agent may be for example a silane compound including a carbon-carbon unsaturated bond such as vinyltrimethoxysilane, vinyltriethoxysilane, vinyl trichlorosilane, vinyltris(β-methoxyethoxy)silane; or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and the like, but is not limited thereto.

The semiconductor photoresist composition may be formed into a pattern having a high aspect ratio without a collapse. Accordingly, in order to form a fine pattern having a width of, for example, 5 nm to 100 nm, for example, 5 nm to 80 nm, for example, 5 nm to 70 nm, for example, 5 nm to 50 nm, for example, 5 nm to 40 nm, for example, 5 nm to 30 nm, or for example, 5 nm to 20 nm, the semiconductor photoresist composition may be used for a photoresist process using light in a wavelength ranging from 5 nm to 150 nm, for example, 5 nm to 100 nm, 5 nm to 80 nm, 5 nm to 50 nm, 5 nm to 30 nm, or 5 nm to 20 nm. Accordingly, the semiconductor photoresist composition according to an embodiment may be used to realize extreme ultraviolet lithography using an EUV light source of a wavelength of 13.5 nm.

According to according to another embodiment, a method of forming patterns using the aforementioned semiconductor photoresist composition is provided. For example, the manufactured pattern may be a photoresist pattern.

The method of forming patterns according to an embodiment includes forming an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

Hereinafter, a method of forming patterns using the semiconductor photoresist composition is described referring to FIGS. 1 to 5. FIGS. 1 to 5 are cross-sectional views for explaining a method of forming patterns using a semiconductor photoresist composition according to an embodiment.

Referring to FIG. 1, an object for etching is prepared. The object for etching may be a thin film 102 formed on a semiconductor substrate 100. Hereinafter, the object for etching is limited to the thin film 102. A whole surface of the thin film 102 is washed to remove impurities and the like remaining thereon. The thin film 102 may be for example a silicon nitride layer, a polysilicon layer, or a silicon oxide layer.

Subsequently, the resist underlayer composition for forming a resist underlayer 104 is spin-coated on the surface of the washed thin film 102. However, the embodiment is not limited thereto, and known various coating methods, for example a spray coating, a dip coating, a knife edge coating, a printing method, for example an inkjet printing and a screen printing, and the like may be used.

The coating process of the resist underlayer may be omitted, and hereinafter, a process including a coating of the resist underlayer is described.

Then, the coated composition is dried and baked to form a resist underlayer 104 on the thin film 102. The baking may be performed at 100° C. to 500° C., for example, 100° C. to 300° C.

The resist underlayer 104 is formed between the substrate 100 and a photoresist layer 106 and thus may prevent non-uniformity and pattern-forming capability of a photoresist line width when a ray reflected from on the interface between the substrate 100 and the photoresist layer 106 or a hardmask between layers is scattered into an unintended photoresist region.

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

More specifically, the formation of a pattern by using the semiconductor photoresist composition may include coating the semiconductor photoresist composition on the substrate 100 having the thin film 102 through spin coating, slit coating, inkjet printing, and the like and then, drying it to form the photoresist layer 106.

The semiconductor photoresist composition has already been illustrated in detail and will not be illustrated again.

Subsequently, a substrate 100 having the photoresist layer 106 is subjected to a first baking process. The first baking process may be performed at about 80° C. to about 120° C.

Referring to FIG. 3, the photoresist layer 106 may be selectively exposed.

For example, the exposure may use an activation radiation with light having a high energy wavelength such as EUV (extreme ultraviolet; a wavelength of 13.5 nm), an E-Beam (an electron beam), and the like as well as a short wavelength such as an i-line (a wavelength of 365 nm), a KrF excimer laser (a wavelength of 248 nm), an ArF excimer laser (a wavelength of 193 nm), and the like.

More specifically, light for the exposure according to an embodiment may have a short wavelength ranging from 5 nm to 150 nm and a high energy wavelength, for example, EUV (extreme ultraviolet; a wavelength of 13.5 nm), an E-Beam (an electron beam), and the like.

The exposed region 106a of the photoresist layer 106 has a different solubility from the non-exposed region 106b of the photoresist layer 106 by forming a polymer by a cross-linking reaction such as condensation between organometallic compounds.

Subsequently, the substrate 100 is subjected to a second baking process. The second baking process may be performed at a temperature of 90° C. to 200° C. The exposed region 106a of the photoresist layer 106 becomes easily indissoluble regarding a developing solution due to the second baking process.

In FIG. 4, the non-exposed region 106b of the photoresist layer is dissolved and removed using the developing solution to form a photoresist pattern 108. Specifically, the non-exposed region 106b of the photoresist layer is dissolved and removed by using an organic solvent such as 2-heptanone and the like to complete the photoresist pattern 108 corresponding to the negative tone image.

As described above, a developing solution used in a method of forming patterns according to an embodiment may be an organic solvent. The organic solvent used in the method of forming patterns according to an embodiment may be for example ketones such as methylethylketone, acetone, cyclohexanone, 2-heptanone, and the like, alcohols such as 4-methyl-2-propanol, 1-butanol, isopropanol, 1-propanol, methanol, and the like, esters such as propylene glycol monomethyl ether acetate, ethyl acetate, ethyl lactate, n-butyl acetate, butyrolactone, and the like, aromatic compounds such as benzene, xylene, toluene, and the like, or a combination thereof.

However, the photoresist pattern according to an embodiment is not necessarily limited to the negative tone image but may be formed to have a positive tone image. Herein, a developing agent used for forming the positive tone image may be a quaternary ammonium hydroxide composition such as tetraethylammonium hydroxide, tetrapropylammonium hydroxide, tetrabutylammonium hydroxide, or a combination thereof.

As described above, exposure to light having a high energy such as EUV (extreme ultraViolet; a wavelength of 13.5 nm), an E-Beam (an electron beam), and the like as well as light having a wavelength such as i-line (wavelength of 365 nm), KrF excimer laser (wavelength of 248 nm), ArF excimer laser (wavelength of 193 nm), and the like may provide a photoresist pattern 108 having a width of a thickness of 5 nm to 100 nm. For example, the photoresist pattern 108 may have a width of a thickness of 5 nm to 90 nm, 5 nm to 80 nm, 5 nm to 70 nm, 5 nm to 60 nm, 5 nm to 50 nm, 5 nm to 40 nm, 5 nm to 30 nm, or 5 nm to 20 nm.

On the other hand, the photoresist pattern 108 may have a pitch of having a half-pitch of less than or equal to about 50 nm, for example less than or equal to about 40 nm, for example less than or equal to about 30 nm, for example less than or equal to about 20 nm, for example less than or equal to about 15 nm, and a line width roughness of less than or equal to about 10 nm, less than or equal to about 5 nm, less than or equal to about 3 nm, or less than or equal to about 2 nm.

Subsequently, the photoresist pattern 108 is used as an etching mask to etch the resist underlayer 104. Through this etching process, an organic layer pattern 112 is formed. The organic layer pattern 112 also may have a width corresponding to that of the photoresist pattern 108.

Referring to FIG. 5, the exposed thin film 102 is etched by applying the photoresist pattern 108 as an etching mask. As a result, the thin film is formed as a thin film pattern 114.

The etching of the thin film 102 may be for example dry etching using an etching gas and the etching gas may be for example CHF3, CF4, Cl2, BCl3 and a mixed gas thereof.

In the exposure process, the thin film pattern 114 formed by using the photoresist pattern 108 formed through the exposure process performed by using an EUV light source may have a width corresponding to that of the photoresist pattern 108. For example, the thin film pattern 114 may have a width of 5 nm to 100 nm which is equal to that of the photoresist pattern 108. For example, the thin film pattern 114 formed by using the photoresist pattern 108 formed through the exposure process performed by using an EUV light source may have a width of 5 nm to 90 nm, 5 nm to 80 nm, 5 nm to 70 nm, 5 nm to 60 nm, 5 nm to 50 nm, 5 nm to 40 nm, 5 nm to 30 nm, or 5 nm to 20 nm, and more specifically a width of less than or equal to 20, like that of the photoresist pattern 108.

Mode for Invention

Hereinafter, the present invention will be described in more detail through examples of the preparation of the aforementioned semiconductor photoresist composition. However, the present invention is technically not restricted by the following examples.

EXAMPLES

Synthesis Example 1: Synthesis of Intermediate A

Ph$_4$Sn (20 g, 46.8 mmol) was put in a 250 mL 2-necked round-bottomed flask, 60 mL of propionic acid was added thereto and then, heated under reflux for 24 hours, and the non-reacted propionic acid was removed therefrom under a reduced pressure, obtaining a compound represented by Intermediate A at a yield of 85%.

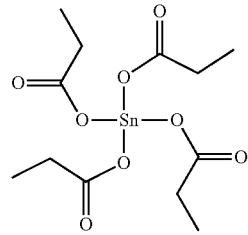

[Intermediate A]

Synthesis Example 2: Synthesis of Intermediate B

Ph$_4$Sn (20 g, 46.8 mmol) was put in a 250 mL 2-necked round-bottomed flask, 60 mL of acetic acid was added thereto and then, heated under reflux for 24 hours, and the non-reacted acetic acid was removed therefrom under a reduced pressure, obtaining a compound represented by Intermediate B at a yield of 90%.

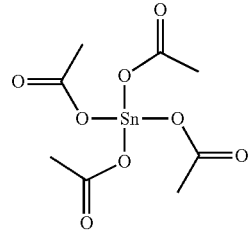

[Intermediate B]

Synthesis Example 3: Synthesis of Organotin Compound

The compound (5 g, 12.2 mmol) represented by Intermediate A according to Synthesis Example 1 was put in a 250 mL 2-necked round-bottomed flask, 50 mL of anhydrous toluene was added thereto, and a solution prepared by dissolving ethanethiol (0.8 g, 12.2 mmol) in 20 mL of anhydrous toluene was slowly added thereto in a dropwise fashion for 15 minutes, while stirred at room temperature. Subsequently, the obtained mixture was stirred at room temperature for 24 hours. Then, volatile solvents were removed therefrom under a reduced pressure, obtaining a compound represented by Chemical Formula 2 at a yield of 65%.

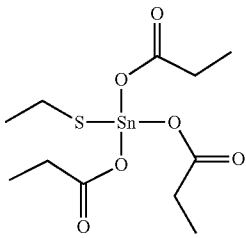

[Chemical Formula 2]

Synthesis Example 4: Synthesis of Organotin Compound

A compound represented by Chemical Formula 3 was synthesized at a yield of 60% according to the same method as Synthesis Example 3 except that dodecanethiol (2.5 g, 12.2 mmol) was used instead of the ethanethiol.

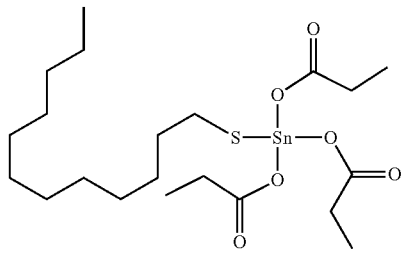

[Chemical Formula 3]

Synthesis Example 5: Synthesis of Organotin Compound

A compound represented by Chemical Formula 4 was synthesized at a yield of 63% according to the same method as Synthesis Example 3 except that thiophenol (1.1 g, 12.2 mmol) was used instead of the ethanethiol.

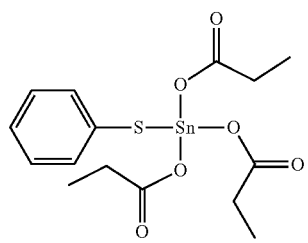

[Chemical Formula 4]

Synthesis Example 6: Synthesis of Organotin Compound

A compound (5 g, 14.1 mmol) represented by Intermediate B according to Synthesis Example 2 was put in a 250 mL 2-necked round-bottomed flask, 50 mL of anhydrous toluene was added thereto, and a solution prepared by dissolving dodecanethiol (2.8 g, 14.1 mmol) in 20 mL of anhydrous toluene was slowly added thereto in a dropwise fashion for 15 minutes, while stirred at room temperature. Then, the obtained mixture was stirred at room temperature for 24 hours. Subsequently, volatile solvents were removed therefrom under a reduced pressure, obtaining a compound represented by Chemical Formula 5 at a yield of 66%.

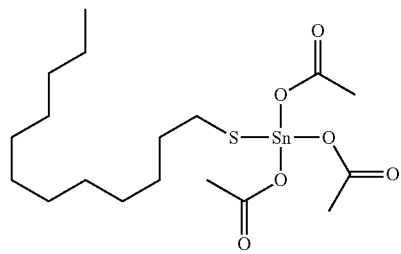

[Chemical Formula 5]

Synthesis Example 7: Synthesis of Organotin Compound

A compound (5 g, 14.1 mmol) represented by Intermediate B according to Synthesis Example 2 was put in a 250 mL 2-necked round-bottomed flask, 50 mL of anhydrous toluene was added thereto, and a solution prepared by dissolving ethanethiol (5.7 g, 28.2 mmol) in 30 mL of anhydrous toluene was slowly added thereto in a dropwise fashion for 15 minutes, while stirred at room temperature. Then, the obtained mixture was stirred at room temperature for 24 hours Subsequently, volatile solvents were removed therefrom under a reduced pressure, obtaining a compound represented by Chemical Formula 6 at a yield of 62%.

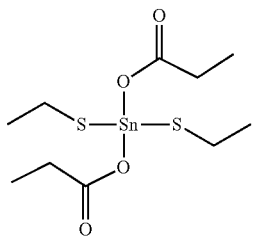

[Chemical Formula 6]

Comparative Synthesis Example 1

Dibutyltin dichloride (10 g, 33 mmol) was dissolved in 30 mL of ether, and 70 mL of a 1 M sodium hydroxide (NaOH) aqueous solution was added thereto and then, stirred for 1 hour. After the stirring, a solid produced therein was filtered, three times washed with 25 mL of deionized water, and dried at 100° C. under a reduced pressure, obtaining an organometallic compound represented by Chemical Formula 7 and having a weight average molecular weight of 1,500 g/mol.

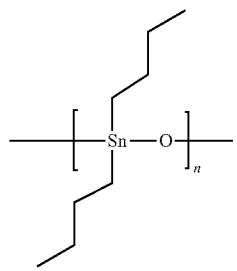

[Chemical Formula 7]

Examples 1 to 5

Each compound represented by Chemical Formulas 2 to 6 according to Synthesis Examples 3 to 7 was dissolved in PGMEA (propylene glycol monomethyl ether acetate) at a concentration of 3 wt % and then, filtered with a 0.1 μm PTFE (polytetrafluoroethylene) syringe filter, preparing photoresist compositions according to Examples 1 to 5.

A disk-shaped silicon wafer having a native-oxide surface and a 4 inch diameter is used as a substrate for thin film coating and treated in a UV ozone cleaning system for 10 minutes before coating the compositions. On the treated substrate, the semiconductor photoresist compositions according to Examples 1 to 5 are respectively spin-coated at 1500 rpm for 30 seconds and then, baked (baked after applied, PAB (post-apply bake)) at 100° C. for 120 seconds to form a photoresist thin films.

After the coating and the baking, the thicknesses of the films are measured through ellipsometry, which is about 25 nm.

Comparative Example 1

A semiconductor photoresist composition and a photoresist thin film including the same according to Comparative Example 1 were prepared according to the same method as above except that the compound represented by Chemical Formula 7 according to Comparative Synthesis Example 1 was dissolved in 4-methyl-2-pentanol at a concentration of 1 wt %. A film obtained after coating and baking the composition had a thickness of about 20 nm.

Evaluation 1: Resolution

The films according to Examples 1 to 5 and Comparative Example 1 formed on a disk-shaped silicon wafer in the coating method were exposed to extreme ultraviolet (EUV) to form 12 to 100 nm line/space patterns by varying energy and a focus. After the exposure, the films were baked at 180° C. for 120 seconds, subsequently, dipped in a Petri dish containing 2-heptanone for 60 seconds and taken out thereof, and washed with the same solvent for 10 seconds. Finally, the films were baked at 150° C. for 5 minutes, and then, pattern images thereof were obtained through SEM (scanning electron microscopy). The highest resolutions identified from the SEM images are shown in Table 1.

Evaluation 2: Sensitivity

A linear array of 50 circular pads having a diameter of 500 μm was projected onto a wafer coated with each photoresist composition according to Examples 1 to 5 and Comparative Example 1 by using EUV light (Lawrence Berkeley National Laboratory Micro Exposure Tool, MET). Herein, pad exposure time was adjusted to apply an increased EUV dose to each pad.

Subsequently, the resist and the substrate were exposed on a hot plate at 160° C. for 120 seconds for post-exposure baking (PEB). The baked films was respectively dipped in a developing solution (2-heptanone) for 30 seconds and additionally washed with the same developer for 10 seconds, forming negative tone images, that is, removing non-exposed coating regions. Finally, the films were respectively baked on the hot plate at 150° C. for 2 minutes, completing a process.

Then, an ellipsometer was used to measure a residual resist thickness of the exposed pads. The residual resist thicknesses for each exposure dose were measured and graphed as a function with the exposure doses, showing Dg (energy level at which the development was completed) for each type of resist in Table 1.

Evaluation 3: Solubility and Storage Stability

The photoresist compositions for a semiconductor according to Examples 1 to 5 and Comparative Example 1 were evaluated with respect to solubility and storage stability according to the following references, and the results are shown in Table 1.

[Solubility]

The compounds represented by Chemical Formulas 2 to 6 according to Synthesis Examples 3 to 7 and the compound represented by Chemical Formula 7 according to Comparative Synthesis Example 1 were evaluated with respect to a degree of solubility into 3 levels, based on when dissolved in PGMEA (propylene glycol monomethyl ether acetate) at the following weights.

○: 3 wt % or more dissolved in PGMEA
Δ: less than 3 wt % dissolved in PGMEA
×: less than 1 wt % dissolved in PGMEA

[Storage Stability]

After allowing the compounds to stand at 25° C. (room temperature) for predetermined time, the compounds were examined with respect to a degree of precipitation with naked eyes to set a reference for storage and evaluate them according to the following 3 levels.

○: storable for 1 month or longer
Δ: storable for 1 week to less than 1 month
×: storable for less than 1 week

TABLE 1

|  | Resolution (nm) (HP*) | Sensitivity | Solubility | Storage stability |
| --- | --- | --- | --- | --- |
| Example 1 | 18 | 22.72 | ○ | ○ |
| Example 2 | 20 | 25.21 | ○ | ○ |
| Example 3 | 20 | 31.18 | ○ | ○ |
| Example 4 | 20 | 25.21 | ○ | ○ |
| Example 5 | 18 | 31.18 | ○ | ○ |
| Comparative Example 1 | 26 | — | X | — |

(*HP: half-pitch reference)

Referring to the results of Table 1, the photoresist compositions for a semiconductor according to Examples 1 to 5 exhibited excellent solubility and storage stability, compared with that of Comparative Example 1, and in addition, the patterns formed by using the same exhibited excellent sensitivity, compared with the pattern formed of the composition according to Comparative Example 1. On the contrary, since the photoresist composition for a semiconductor according to Comparative Example 1 exhibited insufficient solubility for an xylene solvent, it was practically difficult to evaluate the storage-stability of the composition and the pattern formation using the same.

Hereinbefore, the certain embodiments of the present invention have been described and illustrated, however, it is apparent to a person with ordinary skill in the art that the present invention is not limited to the embodiment as described, and may be variously modified and transformed without departing from the spirit and scope of the present invention. Accordingly, the modified or transformed embodiments as such may not be understood separately from the technical ideas and aspects of the present invention, and the modified embodiments are within the scope of the claims of the present invention.

The invention claimed is:

1. A semiconductor photoresist composition, comprising an organometallic compound represented by Chemical Formula 1 and a solvent:

[Chemical Formula 1]

$$R-S-\underset{Z}{\overset{X}{Sn}}-Y$$

Wherein, in Chemical Formula 1,
R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, —C(=O)R$^1$ (wherein, R$^1$ is hydrogen or a substituted or unsubstituted C1 to C20 alkyl group), or a combination thereof, X, Y, and Z are each independently —OR$^a$, —SR$^b$, —OC(=O)R$^c$, or —SC(=O)R$^d$, R$^a$ and R$^b$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and R$^c$ and R$^d$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group or a combination thereof.

2. The semiconductor photoresist composition of claim 1, wherein R is a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, —C(=O)R$^1$ (wherein, R$^1$ is hydrogen or a substituted or unsubstituted C1 to C8 alkyl group), or a combination thereof.

3. The semiconductor photoresist composition of claim 1, wherein R is a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, a formyl group, an acetyl group, a propanoyl group, a butanoyl group, or a combination thereof.

4. The semiconductor photoresist composition of claim 1, wherein

R$^a$ and R$^b$ are each independently a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, and R$^c$ and R$^d$ are each independently hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof.

5. The semiconductor photoresist composition of claim 1, wherein

R$^a$ and R$^b$ are each independently a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and R$^c$ and R$^d$ are each independently hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

6. The semiconductor photoresist composition of claim 1, wherein the organometallic compound comprises one of compounds represented by Chemical Formula a to Chemical Formula t or a combination thereof:

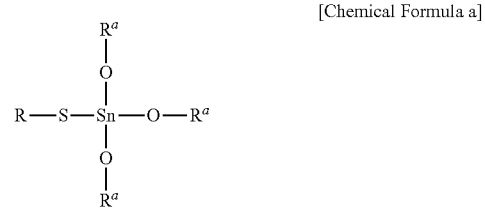

[Chemical Formula a]

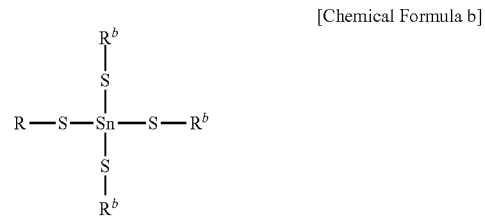

[Chemical Formula b]

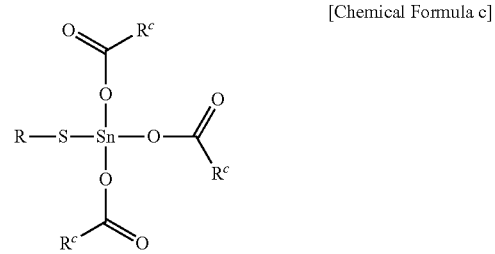

[Chemical Formula c]

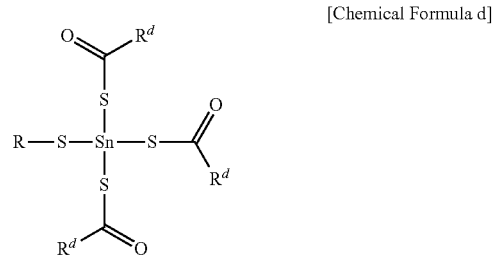

[Chemical Formula d]

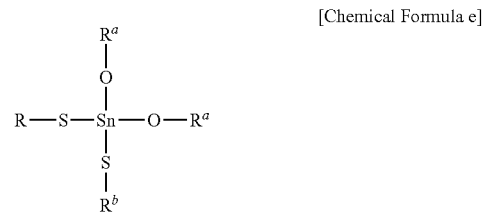

[Chemical Formula e]

[Chemical Formula f]
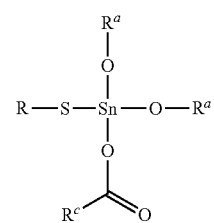
[Chemical Formula g]
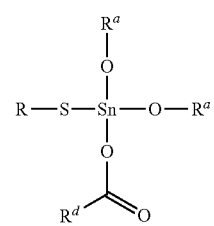
[Chemical Formula h]
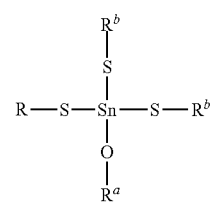
[Chemical Formula i]
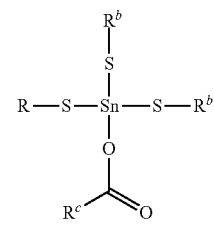
[Chemical Formula j]
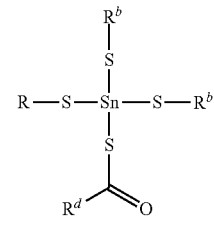
[Chemical Formula k]
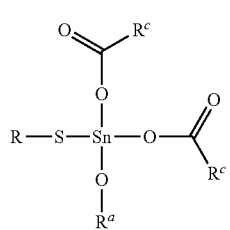
[Chemical Formula l]
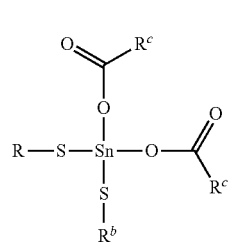
[Chemical Formula m]
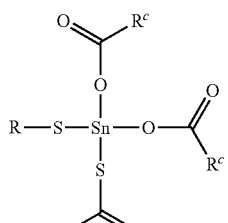
[Chemical Formula n]
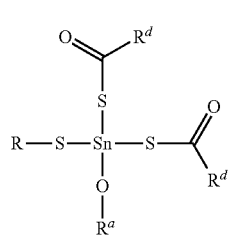
[Chemical Formula o]
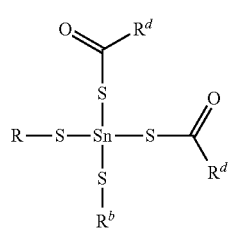
[Chemical Formula p]
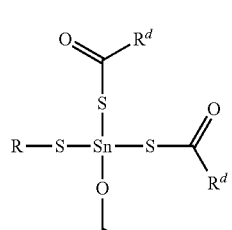
[Chemical Formula q]
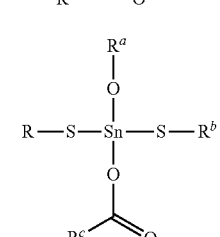
[Chemical Formula r]
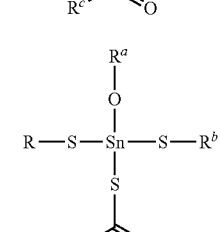
[Chemical Formula s]
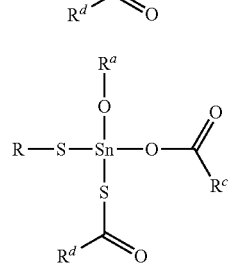

-continued

[Chemical Formula t]

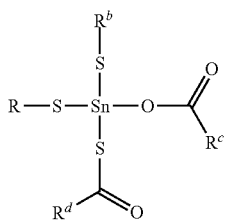

wherein, in Chemical Formula a to Chemical Formula t,

R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, —C(=O)R$^1$ (wherein, R$^1$ is hydrogen or a substituted or unsubstituted C1 to C20 alkyl group), or a combination thereof, R$^a$ and R$^b$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and R$^c$ and R$^d$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

7. The semiconductor photoresist composition of claim 6, wherein R is a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, a formyl group, an acetyl group, a propanoyl group, a butanoyl group, or a combination thereof.

8. The semiconductor photoresist composition of claim 6, wherein

R$^a$ and R$^b$ are each independently methyl group, ethyl group, propyl group, butyl group, isopropyl group, tert-butyl group, 2,2-dimethylpropyl group, cyclopropyl group, cyclobutyl group, cyclopentyl group, cyclohexyl group, ethenyl group, a propenyl group, a butenyl group, an ethynyl group, a propynyl group, a butynyl group, a phenyl group, a tolyl group, a xylene group, a benzyl group, or a combination thereof, and R$^c$ and R$^d$ are each independently hydrogen, methyl group, ethyl group, propyl group, butyl group, isopropyl group, tert-butyl group, 2,2-dimethylpropyl group, cyclopropyl group, cyclobutyl group, cyclopentyl group, cyclohexyl group, ethenyl group, a propenyl group, a butenyl group, an ethynyl group, a propynyl group, a butynyl group, a phenyl group, a tolyl group, a xylene group, a benzyl group, or a combination thereof.

9. The semiconductor photoresist composition of claim 1, which comprises 1 wt % to 30 wt % of the organometallic compound represented by Chemical Formula 1, based on 100 wt % of the semiconductor photoresist composition.

10. The semiconductor photoresist composition of claim 1, further comprising an additive of a surfactant, a crosslinking agent, a leveling agent, or a combination thereof.

11. A method of forming patterns, comprising
forming an etching-objective layer on a substrate,
coating the semiconductor photoresist composition of claim 1 on the etching-objective layer to form a photoresist layer,
patterning the photoresist layer to form a photoresist pattern, and
etching the etching-objective layer using the photoresist pattern as an etching mask.

12. The method of forming patterns of claim 11, wherein the photoresist pattern is formed using light in a wavelength of 5 nm to 150 nm.

13. The method of forming patterns of claim 11, which further comprises providing a resist underlayer formed between the substrate and the photoresist layer.

14. The method of forming patterns of claim 13, wherein the photoresist pattern has a width of 5 nm to 100 nm.

* * * * *